United States Patent
Lee et al.

(10) Patent No.: US 10,340,903 B2
(45) Date of Patent: Jul. 2, 2019

(54) SEMICONDUCTOR DEVICE AND OPERATION METHOD THEREOF

(71) Applicant: ELECTRONICS AND TELECOMMUNICATIONS RESEARCH INSTITUTE, Daejeon (KR)

(72) Inventors: Woojoo Lee, Daejeon (KR); Jae-Jin Lee, Daejeon (KR); Sukho Lee, Daejeon (KR); Kyuseung Han, Sejong (KR); Sang Pil Kim, Sejong (KR); Young Hwan Bae, Daejeon (KR)

(73) Assignee: ELECTRONICS & TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/725,905

(22) Filed: Oct. 5, 2017

(65) Prior Publication Data
US 2018/0145671 A1 May 24, 2018

(30) Foreign Application Priority Data

Nov. 24, 2016 (KR) .................. 10-2016-0157746
Jun. 15, 2017 (KR) .................. 10-2017-0076069

(51) Int. Cl.
*H03K 3/012* (2006.01)
*H03K 5/134* (2014.01)
*H03K 5/00* (2006.01)

(52) U.S. Cl.
CPC ... *H03K 5/134* (2014.07); *H03K 2005/00143* (2013.01)

(58) Field of Classification Search
CPC .................. G06F 1/3206; H03K 5/134; H03K 2005/00143
USPC ........................................ 327/262
See application file for complete search history.

(56) References Cited

U.S. PATENT DOCUMENTS

| | | |
|---|---|---|
| 2007/0272948 A1 | 11/2007 | Koo et al. |
| 2010/0115475 A1* | 5/2010 | Buonpane ........... G06F 17/5063 716/132 |
| 2011/0169563 A1* | 7/2011 | Bhaumik .............. G06F 1/3203 327/544 |
| 2012/0007158 A1 | 1/2012 | Yoon et al. |
| 2013/0156147 A1 | 6/2013 | Dadia |
| 2014/0089881 A1 | 3/2014 | Tetelbaum |

(Continued)

OTHER PUBLICATIONS

Woojoo Lee et al., "Dynamic Thermal Management for FinFET-Based Circuits Exploiting the Temperature Effect Inversion Phenomenon", ISLPED '14, Aug. 13, 2015, pp. 105-110, ACM.

(Continued)

Primary Examiner — Dinh T Le

(57) ABSTRACT

Provided is a semiconductor device including a target circuit, a monitoring circuit, and a voltage controller. The target circuit includes a transistor. The monitoring circuit is configured to measure a temperature of the target circuit or measure a delay time between an input and an output of the target circuit. The voltage controller is configured to adjust a driving voltage for driving the target circuit or a back-bias voltage for adjusting a threshold voltage of the transistor by referring to at least one of the temperature and the delay time. As the temperature increases, the delay time decreases.

15 Claims, 10 Drawing Sheets

(56) References Cited

U.S. PATENT DOCUMENTS

| | | |
|---|---|---|
| 2015/0180227 A1* | 6/2015 | Sekigawa ............... H02M 1/08 |
| | | 361/88 |
| 2015/0236169 A1 | 8/2015 | Park et al. |
| 2017/0222648 A1 | 8/2017 | Lee et al. |

OTHER PUBLICATIONS

Ermao Cai et al., "Exploring Aging Deceleration in FinFET-Based Multi-Core Systems", ICCAD '16, 2016, pp. 1-8, ACM.
Ermao Cai et al., "TEI-Turbo: Temperature Effect Inversion-Aware Turbo Boost for FinFET-Based Multi-Core Systems", ICCAD, Nov. 6, 2015, pp. 500-507, IEEE.

\* cited by examiner

SEMICONDUCTOR DEVICE AND OPERATION METHOD THEREOF

CROSS-REFERENCE TO RELATED APPLICATIONS

This U.S. non-provisional patent application claims priority under 35 U.S.C. § 119 of Korean Patent Application No. 10-2016-0157746, filed on Nov. 24, 2016, and Korean Patent Application No. 10-2017-0076069 filed on Jun. 15, 2017, the entire contents of which are hereby incorporated by reference.

BACKGROUND

The present disclosure herein relates to a semiconductor device, and more particularly, to a semiconductor device using the temperature-effect-inversion (TEI) in which a delay time decreases as a temperature increases and an operation method thereof.

Digital circuit design technology may be divided into high-performance design technology and low-power design technology. Existing desktops have mainly developed with high-performance design technology, and mobile devices such as smart phones, tablet PCs, and wearable devices have mainly developed with low power design technology.

High-performance circuit design technique has its object to maximize the operating speed or operating performance of a digital circuit without considering power consumption. In order to reduce power consumption of a circuit, low-power circuit design technique has its object to minimize power consumption by lowering driving voltage or driving frequency such as Dynamic Voltage and Frequency Scaling (DVFS) or by using clock gating or power gating such as Dynamic Power Management (DPM).

Meanwhile, with the recent spread of mobile devices, researches on technologies that can provide both the advantages of low-power circuit technology and the advantages of high-performance circuit design technology are being actively carried out due to large size of data and high-speed communication.

SUMMARY

The present disclosure provides a semiconductor device capable of reducing power consumption and improving operation speed by using the temperature-effect-inversion (TEI).

The present disclosure further improves the performance of a semiconductor device using the TEI by adjusting the threshold voltage of a transistor with back-biasing.

An embodiment of the inventive concept provides a semiconductor device including: a target circuit including a transistor; a monitoring circuit configured to measure a temperature of the target circuit and measure a delay time between an input and an output of the target circuit; and a voltage controller configured to adjust a driving voltage for driving the target circuit and a back-bias voltage for adjusting a threshold voltage of the transistor by referring to at least one of the temperature and the delay time, wherein as the temperature increases, the delay time decreases.

In an embodiment, the controller may adjust at least one of the driving voltage and the back-bias voltage by referring to a first power consumption amount decreased by the adjusted driving voltage and a second power consumption amount increased by the adjusted back-bias voltage.

In an embodiment, when the first power consumption amount is greater than the second power consumption amount, the controller may adjust a level of the back-bias voltage to lower a level of the threshold voltage.

In an embodiment, when the first power consumption amount is less than the second power consumption amount, the controller may adjust a level of the back-bias voltage to raise a level of the threshold voltage.

In an embodiment, the controller may adjust at least one of the driving voltage and the back-bias voltage by referring to a table for relationship between the temperature, the delay time, the threshold voltage, and the driving voltage.

In an embodiment, the monitoring circuit may include: a temperature sensor configured to measure the temperature of the target circuit; and a ring oscillator configured to measure the delay time between the input and the output of the target circuit.

In an embodiment, the driving voltage is an Ultra-Low Voltage (ULV) of 1 V or less.

In an embodiment, the transistor may include at least one of a MOSFET transistor, a FinFET transistor, and a dual gate transistor.

In an embodiment, the delay time may be a time between an input signal to a gate electrode of the transistor and an output signal from the transistor.

In an embodiment, the voltage controller may include: a driving voltage controller configured to adjust the driving voltage; and a back-bias controller configured to adjust the back-bias voltage.

In an embodiment of the inventive concept, provided is an operation method of a semiconductor device including a transistor. The method includes: measuring at least one of a temperature of the transistor and a delay time between an input and an output of the transistor; adjusting a driving voltage for driving the transistor by referring to at least one of the temperature and the delay time; and adjusting a back-bias voltage for adjusting a threshold voltage of the transistor, wherein as the temperature increases, the delay time decreases.

In an embodiment, the method may further include: calculating a first power consumption amount decreased by the adjusted driving voltage; calculating a second power consumption amount increased by the adjusted back-bias voltage; and comparing the first power consumption amount with the second power consumption amount.

In an embodiment, the method may further include, when the first power consumption amount is greater than the second power consumption amount, adjusting a level of the back-bias voltage to lower a level of the threshold voltage.

In an embodiment, the method may further include, when the first power consumption amount is less than the second power consumption amount, adjusting a level of the back-bias voltage to raise a level of the threshold voltage.

In an embodiment, the adjusting of the driving voltage and the adjusting of the back-bias voltage may be executed at the same time or at different times.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
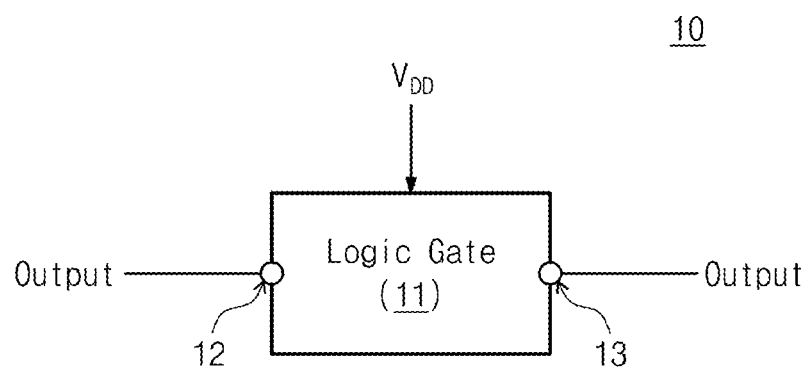
FIG. 1 is a block diagram illustrating a logic circuit according to an embodiment of the inventive concept.

Hereinafter, embodiments of the inventive concept will be described in more detail with reference to the accompanying drawings. In the description below, details such as detailed configurations and structures are simply provided to help overall understanding. Therefore, without departing from the technical idea and scope of the inventive concept, modifications on embodiments described in this specification may be performed by those skilled in the art. Furthermore, descriptions of well-known functions and structures are omitted for clarity and conciseness. The terms used herein are defined in consideration of functions of the inventive concept and are not limited to specific functions. The definition of terms may be determined based on the details in description.

Modules in drawings or detailed description below may be shown in the drawings or may be connected to another component other than components described in detailed description. Each of connections between modules or components may be direct or indirect. Each of connections between modules or components may be a connection by communication or a physical access.

Components described with reference to terms such as parts, units, modules, and layers used in detailed description may be implemented in software, hardware, or a combination thereof. Exemplarily, software may be machine code, firmware, embedded code, and application software. For example, hardware may include an electrical circuit, an electronic circuit, a processor, a computer, an integrated circuit, integrated circuit cores, a pressure sensor, an inertial sensor, microelectromechanical systems (MEMS), a passive device, or a combination thereof.

Unless otherwise defined, all terms including technical or scientific meanings used in the specification have meanings understood by those skilled in the art. In general, the terms defined in the dictionary are interpreted to have the same meanings as contextual meanings and unless they are clearly defined in the specification, are not to be interpreted to have ideal or excessively formal meanings.

FIG. 1 is a block diagram illustrating a logic circuit according to an embodiment of the inventive concept. Referring to FIG. 1, a semiconductor device 10 may include a logic gate 11, an input terminal 12, and an output terminal 13. The semiconductor device 10 may be at least a part of various processors for processing digital signals such as a processor, a central processing unit (CPU), a graphic processing unit (GPU), a system on chip (SoC), an application processor (AP), and an Accelerated Processing Unit (APU).

The logic gate 11 may be includes various semiconductor elements such as a FinFET, a MOSFET, and a multi-gate transistor (or a dual gate transistor). For example, the logic gate 11 may be driven by a driving voltage VDD. Then, the logic gate 11 performs a logical operation with inputs received through the input terminal 12 and outputs the result of the operation through the output terminal 13. For example, the logic gate 11 may be various logic elements or a combination of logic elements such as AND, NAND, OR, NOR, XOR, and NOT.

Although it is shown in the drawing that the logic gate 11 is used, the inventive concept may also be applied to a memory device. That is, according to an embodiment, the logic gate 11 may be replaced by a memory device such as a NAND flash, a NOR flash, or the like. However, for convenience of explanation, a logic gate will be mainly described herein.

The logic gate 11 constituting the semiconductor device 10 may operate in Ultra-Low-Voltage (ULV). For example, the ULV may mean a driving voltage of about 1 V or less. The logic gate 11 may have a temperature-effect-inversion (TEI) characteristic when driven by a ULV.

The TEI characteristic may mean a characteristic of reducing a delay time of a logic gate as a temperature increases. In general, a digital circuit has a characteristic in which a delay time increases as a temperature increases. That is, as a temperature increases, the operating speed of a typical digital circuit decreases. However, at a driving voltage below a certain critical voltage (e.g., ULV of 1 V or less), the operating speed of a digital circuit increases even if a temperature increases.

For example, the logic gate 11 may have TEI characteristics. That is, when the logic gate 11 is driven by a driving voltage VDD of a certain critical voltage or more, the delay time between the input and the output of the logic gate 11 increases as the temperature increases. However, when the logic gate 11 is driven by a driving voltage VDD below a certain critical voltage, the delay time between the input and the output of the logic gate 11 decreases as the temperature increases.

As described above, the semiconductor device 10 of the inventive concept invention has TEI characteristics in which the delay time between input and output decreases as the temperature increases. As a result, even if a driving voltage is reduced, the performance of the semiconductor device 10 may be improved, so that the power consumption of the semiconductor device 10 can be reduced and the performance can be improved.

Figure 2A:
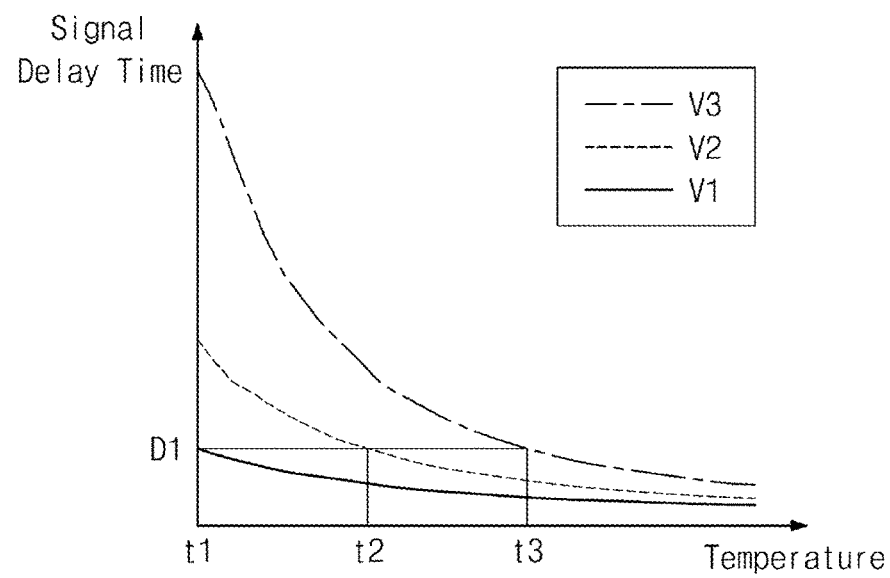
FIGS. 2A and 2B are graphs showing TEI characteristics of a semiconductor device shown in FIG. 1.
Figure 2B:
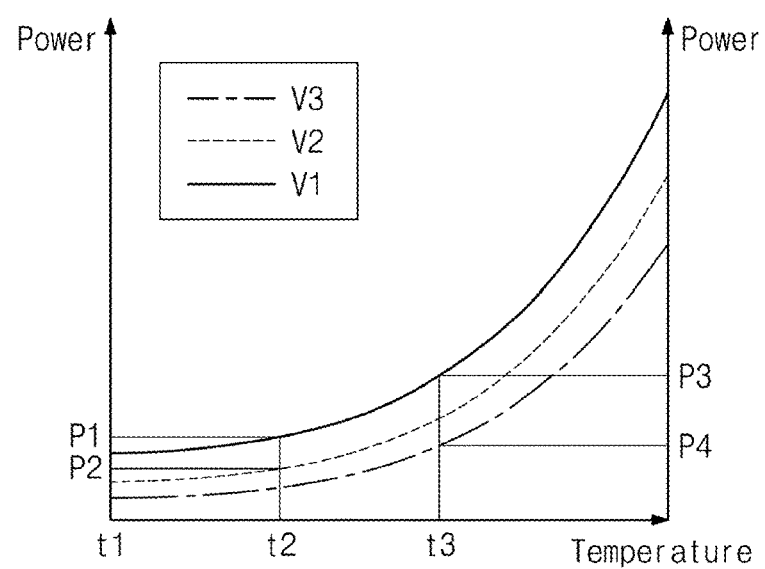

FIGS. 2A and 2B are graphs showing TEI characteristics of the semiconductor device 10 shown in FIG. 1. The X axis in FIG. 2A represents a temperature, and the Y axis represents the delay time of a signal (for example, the delay time between the input and the output of the logic gate 11). The X-axis in FIG. 2B represents a time, and the Y-axis represents power consumption (for example, power consumption of the logic gate 11). Among the voltages V1, V2, and V3 shown in FIGS. 2A and 2B, the magnitude of V1 is the largest and the magnitude of V3 is the smallest.

Referring to FIG. 2A, it is assumed that the current temperature of the logic gate 11 is the first temperature t1 and is driven by the first voltage V1. In this case, as shown in the graph, the signal delay of the logic gate 11 may be the first delay D1.

If the temperature of the logic gate 11 rises to the second temperature t2, even if the same performance (for example, the same delay speed) is maintained, the driving voltage of the logic gate 11 may be lowered to the second voltage V2. Furthermore, if the temperature of the logic gate 11 rises to the third temperature t3, even if the same performance (for example, the same delay speed) is maintained, the driving voltage of the logic gate 11 may be lowered to the third voltage V3.

As a result, the performance of the logic gate 11 may be the same even if the magnitude of the driving voltage is reduced at a driving voltage lower than a specific critical voltage (e.g., ULV) causing the TEI phenomenon.

Referring to FIG. 2B, when the logic gate 11 operates with the second temperature t2 at the first voltage V1, the power consumption of the logic gate 11 may be the first power P1. On the other hand, when the logic gate 11 operates with the second temperature t2 at the second voltage V2, the power consumption of the logic gate 11 may be the second power P2. As a result, when the driving voltage for driving the logic gate 11 is changed from the first voltage V1 to the second voltage V2 at the second temperature t2, the power consumption of the logic gate 11 is reduced by P1-P2.

The driving voltage of the logic gate 11 may be lowered from the first voltage V1 to the third voltage V3 when the temperature of the logic gate 11 changes from the first temperature t1 to the third temperature t3. Of course, in this case, since the delay time of the logic gate 11 is the first delay D1, the performance will remain unchanged. Further, the power consumption of the logic gate 11 will decrease by P3-P4. As a result, by lowering the driving voltage as the temperature of a logic gate increases, the performance of the logic gate may be the same and the power consumption may be reduced.

Figure 3:
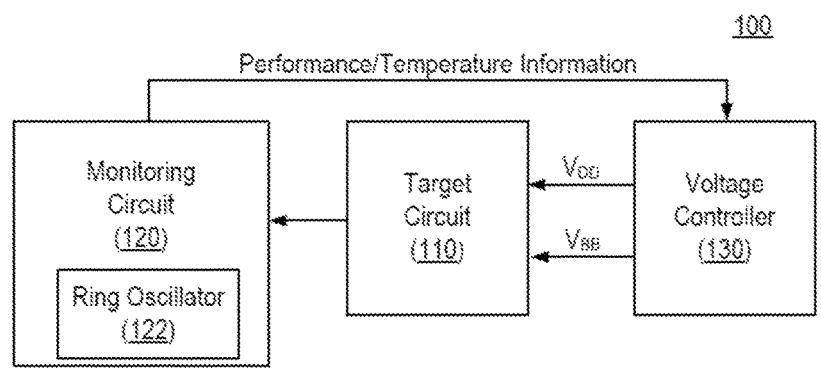
FIG. 3 is a block diagram illustrating a semiconductor device according to an embodiment of the inventive concept.

FIG. 3 is a block diagram illustrating a semiconductor device 100 according to an embodiment of the inventive concept. The semiconductor device 100 may include a target circuit 110, a monitoring circuit 120, and a voltage controller 130.

The target circuit 110 may be the logic gate 11 described with reference to FIG. 1. That is, the target circuit 110 may be a logic gate including various semiconductor elements such as a FinFET, a MOSFET, and a multi-gate transistor (or a dual gate transistor). Alternatively, the target circuit 110 may be a memory device such as a NAND flash. For simplicity of illustration, the inputs and outputs as shown in FIG. 1 are not shown.

For example, the target circuit 110 may include a dual gate transistor, which is a device whose channel width is adjusted by bias voltages applied to two gate electrodes. Alternatively, the target circuit 110 may include a semiconductor device to which a back-biasing technique, which is a technique for adjusting a channel width by applying a bias to both a gate electrode of a semiconductor device and a substrate with the semiconductor device.

For example, the target circuit 110 may be driven by a driving voltage VDD and a back-bias voltage VBB. If the target circuit 110 includes a dual gate transistor, the driving voltage VDD and the back-bias voltage VBB may be applied to the two gate electrodes, respectively. When the target circuit 110 is operated by the back-biasing technique, the driving voltage VDD and the back-bias voltage VBB will be respectively applied to the gate electrode of a transistor included in the target circuit 110 and the body (e.g., the substrate or well region).

The monitoring circuit 120 may measure the performance or temperature of the target circuit 110. For example, the performance of the target circuit 110 may be the delay time between the input to the target circuit 110 and the output from the target circuit 110. For example, the monitoring circuit 120 may include a ring oscillator 122 for measuring the delay time of the target circuit 110 but is not limited thereto.

Although it is shown in the drawing that the monitoring circuit 120 is a separate functional block distinguished from the target circuit 110, the monitoring circuit 120 may be provided inside the target circuit 110 according to an embodiment. Alternatively, a block for measuring a temperature in the monitoring circuit 120 may be provided inside the target circuit 110, and a block for measuring a delay time may be provided outside the target circuit 110.

The monitoring circuit 120 may deliver the measured performance information or temperature information to the voltage controller 130.

The voltage controller 130 may generate various voltages VDD and VBB necessary to operate the target circuit 110. For example, the voltage controller 130 may generate the voltages VDD and VBB based on a voltage supplied from a power management device (e.g., a Power Management Integrated Circuit (PMIC)). The voltage controller 130 may include components for generating various levels of voltages using the supplied power. To this end, the voltage controller 130 may include various components such as a charge pump, a voltage regulator, and the like.

Alternatively, the voltage controller 130 may be a PMIC. Similarly, in this case, the voltage controller 130 may also include various components, such as a charge pump, a voltage regulator, etc., to generate various levels of voltages.

The voltage controller 130 may adjust the levels of the voltages VDD and VBB based on the performance information and/or temperature information received from the monitoring circuit 120. The specific operation of the voltage controller 130 will be described later in detail.

Figure 4:
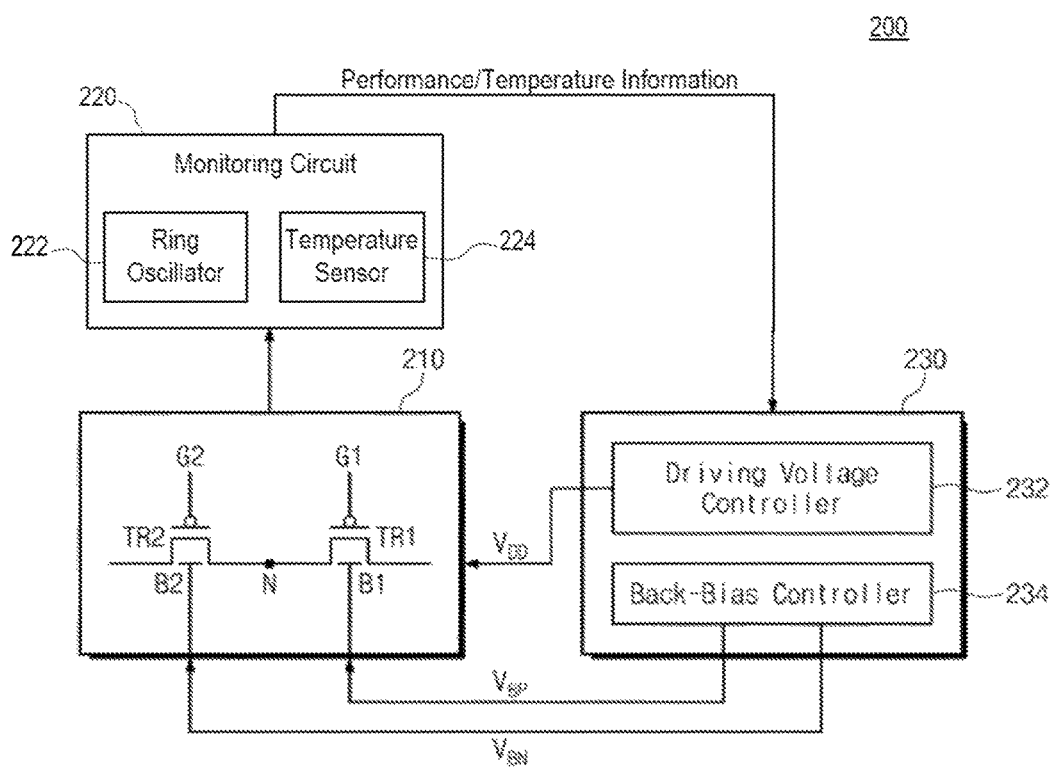
FIG. 4 is a block diagram illustrating a semiconductor device according to an embodiment of the inventive concept.

FIG. 4 is a block diagram illustrating a semiconductor device 200 according to an embodiment of the inventive concept. The semiconductor device 200 may include a target circuit 210, a monitoring circuit 220, and a voltage controller 230.

The target circuit 210 may include various semiconductor elements such as a FinFET, a MOSFET, and a multi-gate transistor (or a dual gate transistor). Illustratively, the target circuit 210 is shown including FETs TR1 and TR2 based on a complementary metal oxide semiconductor (CMOS) but is not limited thereto.

The first transistor TR1 may receive an input signal through a first gate electrode G1 and output an output signal through a node N. The first transistor TR1 may have a first threshold voltage Vth1. However, the value of the first threshold voltage Vth1 may be changed by the back-bias voltage VBP applied to the body B1 of the first transistor TR1.

The second transistor TR2 may receive an input signal through a second gate electrode G2 and output an output signal through a node N. The second transistor TR2 may have a second threshold voltage Vth2. However, the value of the second threshold voltage Vth2 may be changed by the back-bias voltage VBN applied to the body B2 of the second transistor TR2.

If the threshold voltages Vth1 and Vth2 of the transistors TR1 and TR2 decrease due to back-biasing for the transistors TR1 and TR2, even by reducing the driving voltage VDD for driving the transistors TR1 and TR2, the delay time of the target circuit 210 may be kept the same. Here, the delay time of the target circuit 210 may be the time until the output signal is outputted to the node N after the input signal is inputted to the gate electrodes G1 and G2.

The monitoring circuit 220 may measure the delay time and/or temperature of the target circuit 210 and provide it to the voltage controller 230. For example, the monitoring circuit 220 may include a ring oscillator 222 or a temperature sensor 224.

The voltage controller 230 may include a driving voltage controller 232 and a back-bias controller 234. The driving voltage controller 232 may generate the driving voltage VDD for driving the transistors TR1 and TR2. The back-bias controller 234 may generate the back-bias voltages VBP and VBN for performing back-biasing.

The voltage controller 230 may adjust the driving voltage VDD and the back-bias voltages VBP and VBN with reference to a table for the relation (or various combinations) between 'temperature-delay time-threshold voltage-driving voltage'. Such a table may be prepared in advance by a memory vendor and stored in the semiconductor device 200.

Alternatively, the voltage controller 230 may check the change amount of power consumption by the target circuit 200 in real time while adjusting the driving voltage VDD and the back-bias voltages VBP and VBN. Then, based on the change amount of power consumption, whether to keep the current setting or the previous setting may be determined. A method of changing the levels of the driving voltage VDD and the back-bias voltages VBP and VBN by checking the power consumption through the target circuit 200 in real time will be described in detail with reference to FIG. 7 and FIG. 10.

Figure 5:
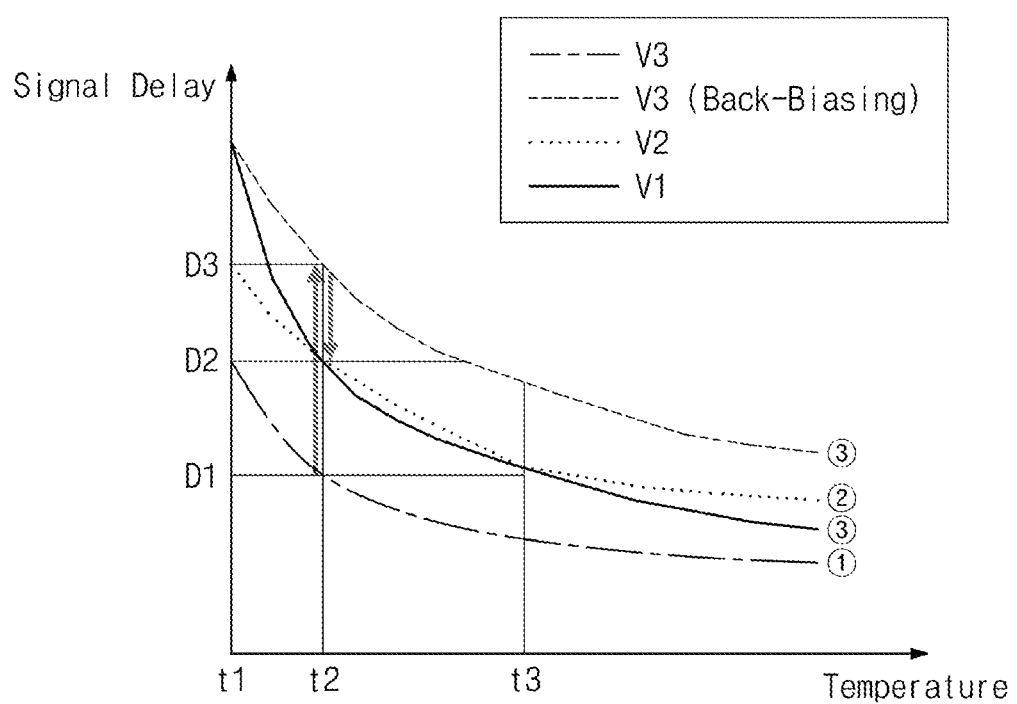
FIG. 5 is a graph showing TEI characteristics of the semiconductor devices shown in FIG. 3 or FIG. 4.

FIG. 5 is a graph showing TEI characteristics of the semiconductor devices shown in FIG. 3 or FIG. 4. The X axis represents time, and the Y axis represents delay time. Among voltages V1, V2, and V3 shown, the magnitude of V1 is the largest and the magnitude of V3 is the smallest. To help understanding of the description, FIG. 4 will be described together.

The target circuit 210 may operate between the first temperature t1 and the third temperature t3. The target circuit 210 may be driven by the voltages V1, V2 and, V3 and the voltages V1, V2, and V3 are voltages below a critical voltage (e.g. ULV) that generates TEI characteristics. However, only a part of a plurality of voltages for driving the target circuit 210 is exemplarily shown as the voltages V1, V2, and V3. The target circuit 210 is currently driven by the first voltage V1 and the current temperature of the target circuit 210 is the second temperature t2. Therefore, the delay time of the target circuit 210 is the first time D1.

The driving voltage VDD of the target circuit 210 is reduced from the first voltage V1 to the third voltage V3. As a result, the power consumed by the target circuit 210 will decrease (see FIG. 2B). On the other hand, the delay time of the target circuit 210 will increase from the first time D1 to the third time D3.

Back-biasing is performed on the target circuit 210. For example, a back-bias voltage VBP may be applied to the body B1 of the first transistor TR1 and a back-bias voltage VBN may be applied to the body B2 of the second transistor TR2. The threshold voltages Vth1 and Vth2 of the transistors TR1 and TR2 may be reduced by back-biasing so that the delay time of the target circuit 210 will be reduced from the third time D3 to the second time D2.

In order to achieve performance equivalent to the second delay time D2 without back-biasing the target circuit 210, the driving voltage VDD of the second voltage V2 should be applied to the target circuit 210. However, in order to achieve performance equivalent to the second delay time D2 while performing back-biasing on the target circuit 210, it is sufficient that the driving voltage VDD of the third voltage V3 is applied to the target circuit 210. That is, by performing back-biasing, power reduction corresponding to the difference between the third voltage V3 and the second voltage V2 may be achieved.

Figure 6:
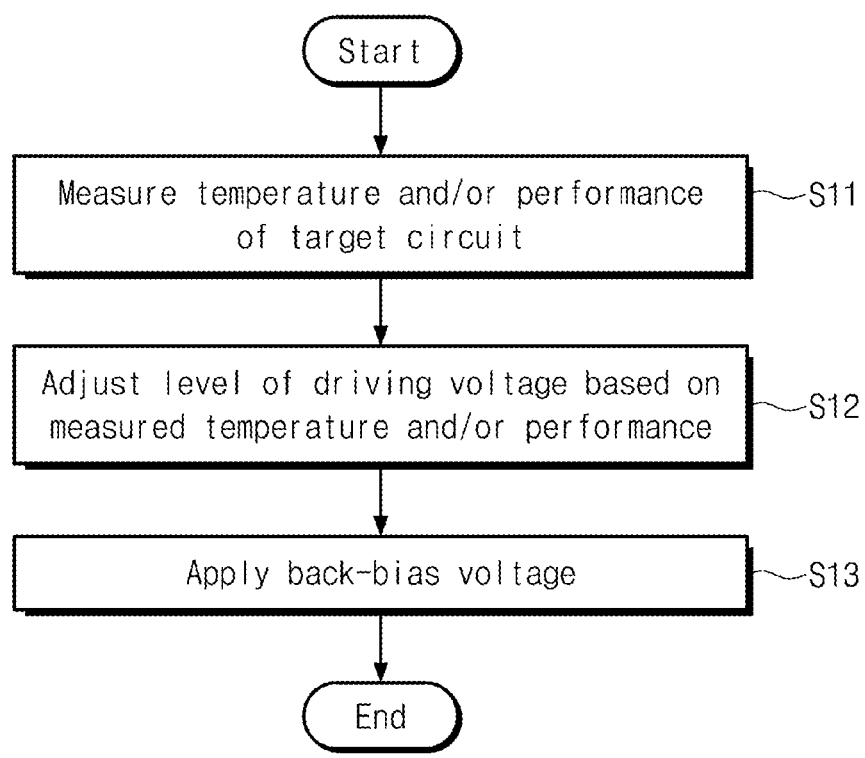
FIG. 6 is a flowchart illustrating an operation method of a semiconductor device according to an embodiment of the inventive concept.

FIG. 6 is a flowchart illustrating an operation method of a semiconductor device according to an embodiment of the inventive concept. To help understanding of the description, FIG. 4 will be described together.

In operation S11, the temperature and/or performance of the target circuit 210 may be detected. For example, the monitoring circuit 220 may be configured to measure the temperature of the target circuit 210 itself or the temperature of the periphery of the target circuit 210. For example, the monitoring circuit 220 may measure a delay time between a signal inputted to the target circuit 210 and a signal outputted from the target circuit 210. For example, the monitoring circuit 220 may include a ring oscillator but is not limited thereto. The monitoring circuit 220 may deliver the measured temperature and/or performance information to the voltage controller 230.

In operation S12, the level of the driving voltage VDD applied to the target circuit 210 may be adjusted. For example, the voltage controller 230 may adjust the level of the driving voltage VDD with reference to the received temperature and/or performance information. For example, the voltage controller 230 may adjust the level of the driving voltage VDD in consideration of the type of task to be processed by an electronic device to which the semiconductor device 200 is applied, the remaining battery level, and the like.

For example, if a task to be processed by an electronic device equipped with the semiconductor device 200 requires rapid processing, it is necessary to reduce the delay time of the target circuit 210. In this case, the voltage controller 230 may raise the level of the driving voltage VDD. On the other hand, if a task to be processed by an electronic device to which the semiconductor device 200 is applied requires no rapid processing, it is regardless to increase the delay time of the target circuit 210. In this case, the voltage controller 230 may lower the level of the driving voltage VDD.

For example, when the battery remaining amount of an electronic device equipped with the semiconductor device 200 is low, it may be the most important to reduce the power consumption of the semiconductor device 200. In this case, the voltage controller 230 may lower the level of the driving voltage VDD for driving the target circuit 210.

In operation S13, back-biasing for the target circuit 210 may be performed. For example, the voltage controller 230 may perform back-biasing to lower the level of the threshold voltage of a transistor included in the target circuit 210. For example, back-biasing may be performed by applying a voltage to the body (e.g., the substrate or well region) where a transistor is disposed. Alternatively, when the transistor included in the target circuit 210 is a dual-gate transistor, back-biasing may be performed by applying a voltage to either one of the two gate electrodes.

In this embodiment, it is described that operation S13 for applying the back-bias voltage is executed after operation S12 for adjusting the level of the driving voltage is executed. However, according to an embodiment, the driving voltage and the back-bias voltage may be applied to a target circuit at the same time.

On the other hand, back-biasing for the target circuit reduces the level of the threshold voltage of a transistor, but the leakage current from the transistor increases due to a decrease in the level of the threshold voltage. This causes an increase in power consumption by the target circuit. Therefore, in relation to a semiconductor device using TEI characteristics, an algorithm that considers both the back-biasing and the influence by the leakage current may be applied. Such embodiments will be described in detail with reference to FIG. 7.

Figure 7:
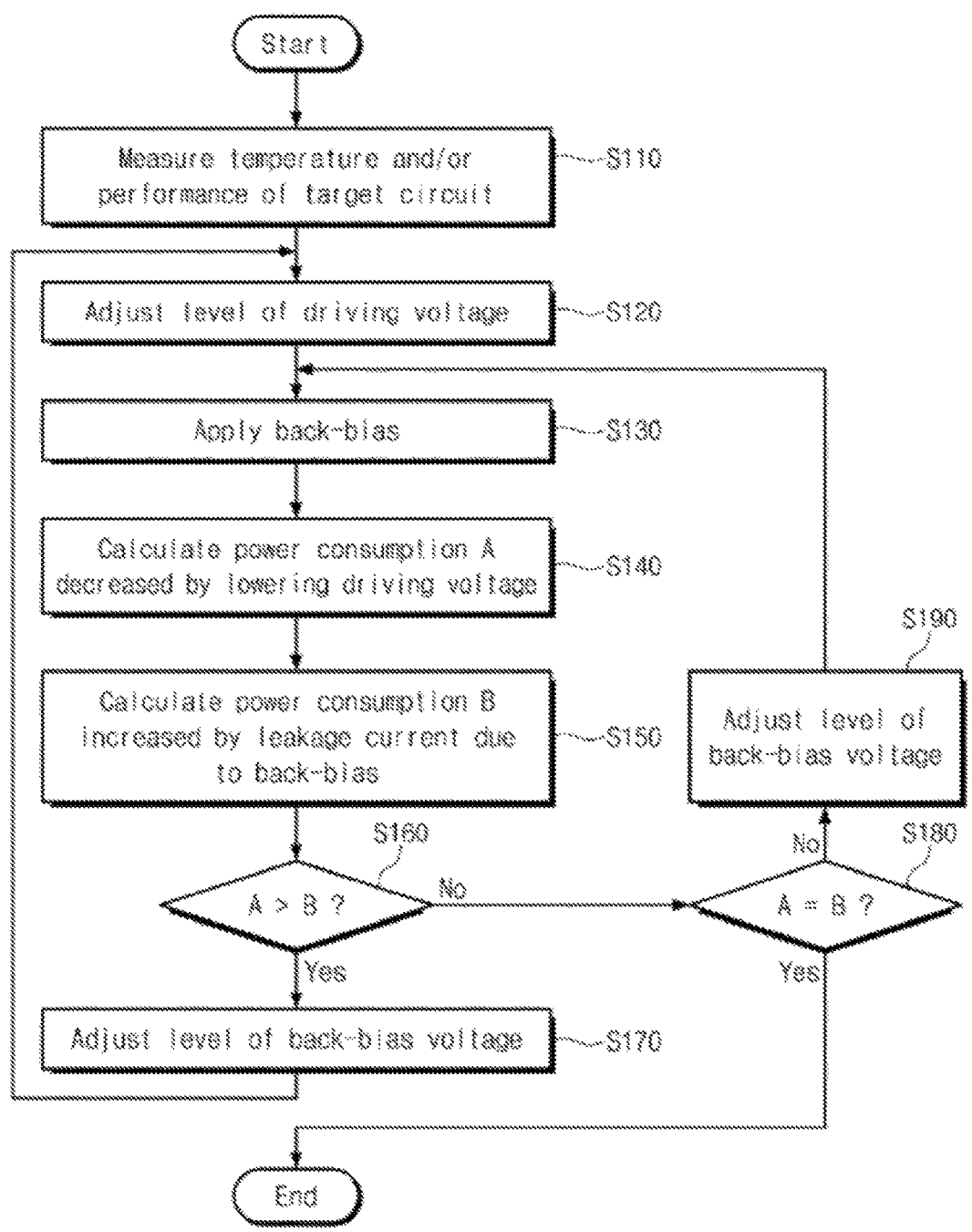
FIG. 7 is a flowchart illustrating an operation method of a semiconductor device according to an embodiment of the inventive concept.

FIG. 7 is a flowchart illustrating an operation method of a semiconductor device according to an embodiment of the inventive concept. To help understanding of the description, FIG. 4 will be described together.

In operation S110, the temperature and/or performance of the target circuit 210 may be detected. This operation is substantially similar to operation S11 in FIG. 6. Therefore, redundant description will be omitted.

In operation S120, the level of the driving voltage VDD applied to the target circuit 210 may be adjusted. For example, the voltage controller 230 may reduce the level of the driving voltage VDD in order to reduce the power consumption by the target circuit 210. This operation is substantially similar to operation S12 in FIG. 6. Therefore, redundant description will be omitted.

In operation S130, back-biasing for the target circuit 210 may be performed. This operation is substantially similar to operation S13 in FIG. 6. Therefore, redundant description will be omitted.

In operation S140, the power consumption A reduced by lowering the level of the driving voltage VDD may be calculated.

In operation S150, the power consumption B increased by the leakage current due to back-biasing may be calculated.

In operation S160, the power consumption A reduced by lowering the level of the driving voltage VDD may be compared with the power consumption B increased by the leakage current due to back-biasing. If the value of A is large, operation S170 is executed, and if not, operation S180 is executed.

In operation S170, the voltage level of back-bias may be changed. For example, the voltage controller 230 may change the voltage level of back-bias in order to lower the level of the threshold voltage of a transistor. If the level of the threshold voltage of a transistor is lowered by back-biasing, for example, the graph indicated by ③' in the graphs shown in FIG. 5 will be further downward. That is, if the level of a driving voltage is maintained as it is, the delay speed of the target circuit 210 will further decrease. Alternatively, even if the level of a driving voltage is reduced, the delay speed of the target circuit 210 may be maintained as it is (operation S110).

In operation S180, it is determined whether the A value and the B value are the same. If the A value and the B value are the same, the procedure ends. That is, if there is a request for a task requiring rapid processing, or if there is no need to reduce power consumption due to battery shortage, the level of the driving voltage VDD and the level of the back-bias will remain unchanged. On the other hand, if the B value is larger than the A value, operation S190 is executed.

In operation S190, the voltage level of back-bias may be changed. For example, the voltage controller 230 may change the voltage level of back-bias in order to increase the level of the threshold voltage of a transistor. If the level of the threshold voltage of a transistor becomes large, for example, the graph indicated by ③' in the graphs shown in FIG. 5 will be further upward. As a result, since the leakage current from a transistor is reduced, the power consumption amount B increased by the leakage current will decrease.

Figure 8:
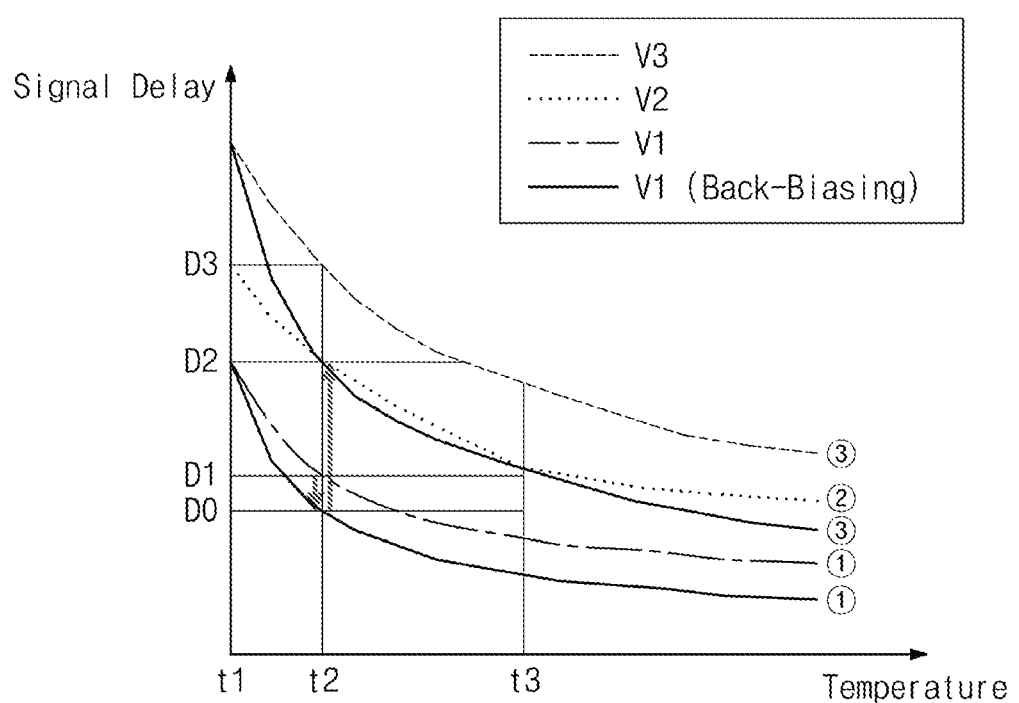
FIG. 8 is a graph showing TEI characteristics of the semiconductor devices shown in FIG. 3 or FIG. 4.

FIG. 8 is a graph showing TEI characteristics of the semiconductor devices shown in FIG. 3 or FIG. 4. The X axis represents time, and the Y axis represents delay time. Among voltages V1, V2, and V3 shown, the magnitude of V1 is the largest and the magnitude of V3 is the smallest. To help understanding of the description, FIG. 4 will be described together.

The target circuit 210 may operate between the first temperature t1 and the third temperature t3. The target circuit 210 may be driven by the voltages V1, V2 and, V3 and the voltages V1, V2, and V3 are voltages below a critical voltage (e.g. ULV) that generates TEI characteristics. However, only a part of a plurality of voltages for driving the target circuit 210 is exemplarily shown as the voltages V1, V2, and V3. The target circuit 210 is currently driven by the first voltage V1 and the current temperature of the target circuit 210 is the second temperature t2. Therefore, the delay time of the target circuit 210 is the first time D1.

The driving voltage VDD of the first voltage V1 is applied to the target circuit 210 and back-biasing is performed. For example, a back-bias voltage VBP may be applied to the body B1 of the first transistor TR1 and a back-bias voltage VBN may be applied to the body B2 of the second transistor TR2. The threshold voltages Vth1 and Vth2 of the transistors TR1 and TR2 may be reduced by back-biasing so that the delay time of the target circuit 210 will be reduced from the first time D1 to D0.

Then, the driving voltage VDD of the third voltage V3 is applied to the target circuit 210. As a result, the delay time of the target circuit 210 will increase from D0 to the second time D2.

In order to achieve performance equivalent to the second delay time D2 without back-biasing the target circuit 210, the driving voltage VDD of the second voltage V2 should be applied to the target circuit 210. However, in order to achieve performance equivalent to the second delay time D2 while performing back-biasing on the target circuit 210, it is sufficient that the driving voltage VDD of the third voltage V3 is applied to the target circuit 210. That is, by performing back-biasing, power reduction corresponding to the difference between the third voltage V3 and the second voltage V2 may be achieved.

Figure 9:
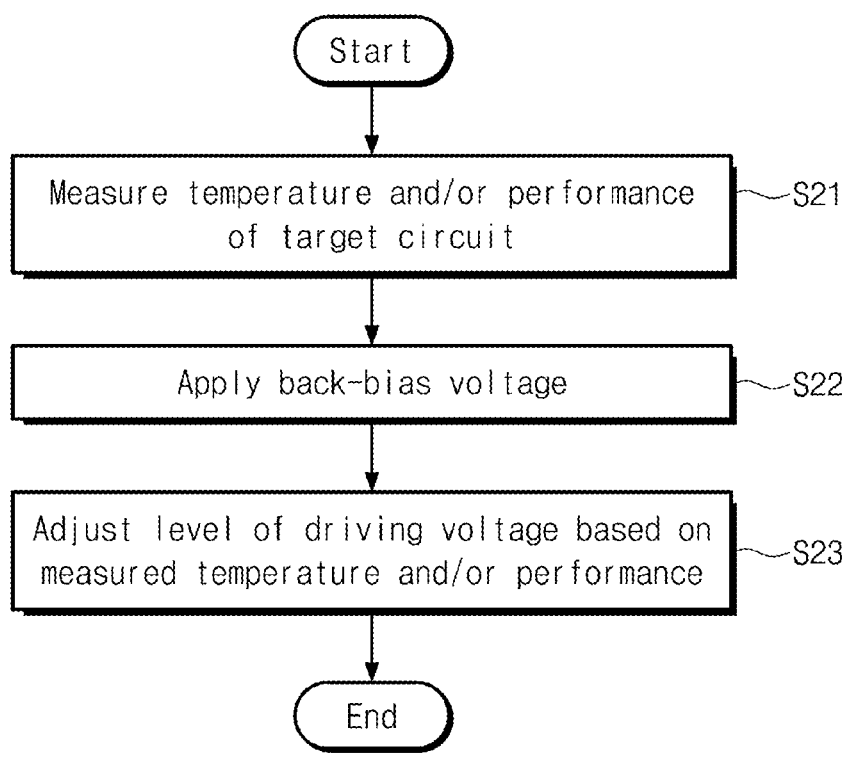
FIG. 9 is a flowchart illustrating an operation method of a semiconductor device according to an embodiment of the inventive concept.

FIG. 9 is a flowchart illustrating an operation method of a semiconductor device according to an embodiment of the inventive concept. To help understanding of the description, FIG. 4 will be described together.

In operation S12, the temperature and/or performance of the target circuit 210 may be detected. For example, the monitoring circuit 220 may measure the temperature of the target circuit 210 itself or the temperature of the periphery of the target circuit 210 and deliver the measured temperature and/or performance information to the voltage controller 230.

In operation S22, back-biasing for the target circuit 210 may be performed. For example, the voltage controller 230 may perform back-biasing on the target circuit 210 in order to lower the level of the threshold voltage of a transistor.

In operation S120, the level of the driving voltage VDD applied to the target circuit 210 may be adjusted. For example, the voltage controller 230 may adjust the level of the driving voltage VDD with reference to the received temperature and/or performance information. For example, the voltage controller 230 may adjust the level of the driving voltage VDD in consideration of the type of work to be processed by an electronic device to which the semiconductor device 200 is applied, the remaining battery level, and the like.

In this embodiment, it is described that after operation S22 for applying back-bias voltage is executed, operation S23 for adjusting the level of a driving voltage is executed. However, according to an embodiment, the driving voltage and the back-bias voltage may be applied to a target circuit at the same time.

Figure 10:
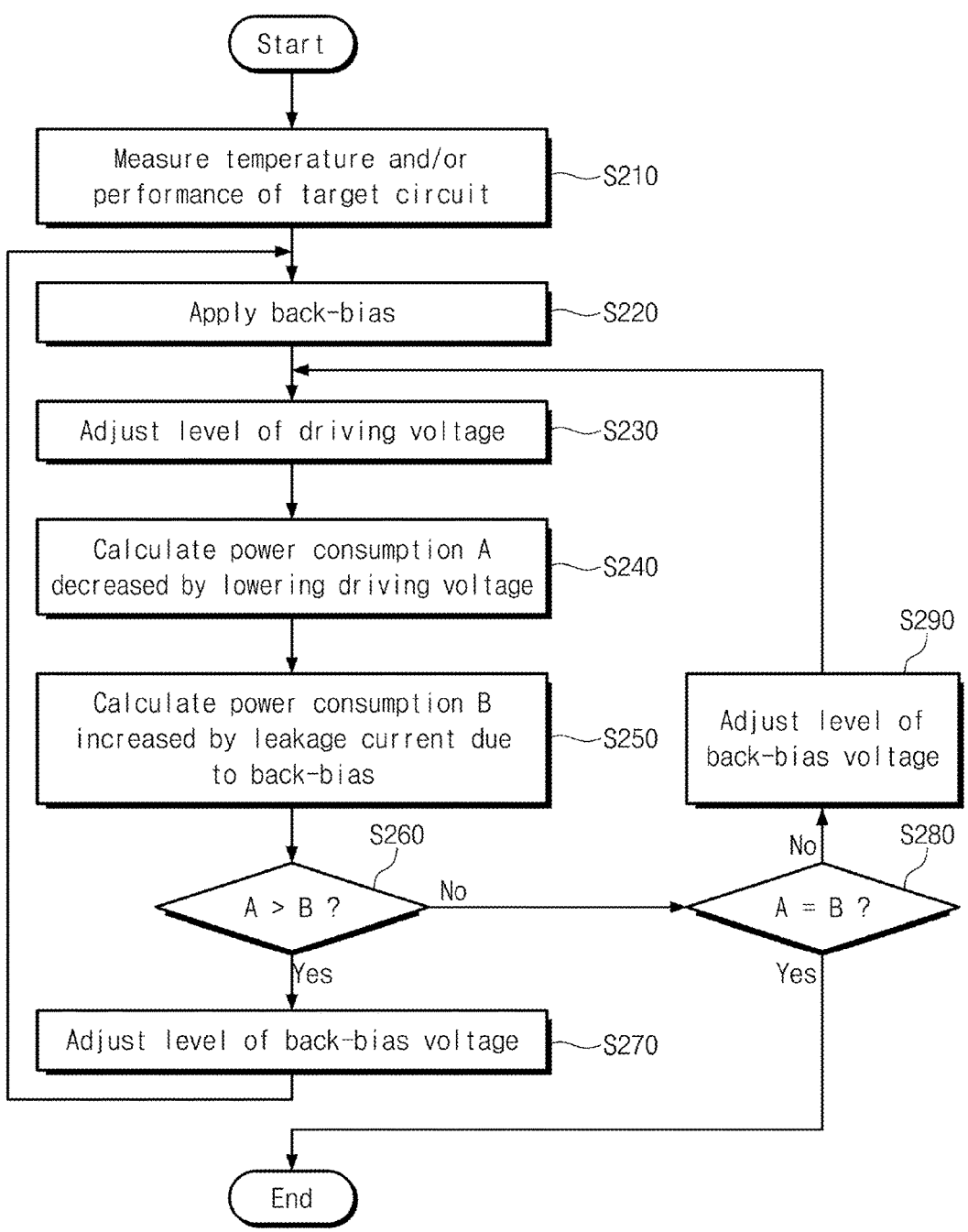
FIG. 10 is a flowchart illustrating an operation method of a semiconductor device according to an embodiment of the inventive concept.

FIG. 10 is a flowchart illustrating an operation method of a semiconductor device according to an embodiment of the inventive concept. To help understanding of the description, FIG. 4 will be described together.

In operation S210, the temperature and/or performance of the target circuit 210 may be detected.

In operation S220, back-biasing for the target circuit 210 may be performed. Back-biasing may be performed to lower the level of the threshold voltage of a transistor included in the target circuit 210.

In operation S230, the level of the driving voltage VDD applied to the target circuit 210 may be adjusted. For example, the voltage controller 230 may reduce the level of the driving voltage VDD with reference to the temperature and/or performance information received from the monitoring circuit 210.

In operation S240, the power consumption A reduced by lowering the level of the driving voltage VDD may be calculated.

In operation S250, the power consumption B increased by the leakage current due to the back-biasing may be calculated.

In operation S260, the power consumption A reduced by lowering the level of the driving voltage VDD may be compared with the power consumption B increased by the leakage current due to back-biasing. If the value of A is large, operation S270 is executed, and if not, operation S280 is executed.

In operation S270, the voltage level of back-bias may be changed. For example, the voltage controller 230 may change the voltage level of back-bias in order to lower the level of the threshold voltage of a transistor. As a result, even if the level of a driving voltage is reduced, the delay speed of the target circuit 210 may be maintained as it is (operation S210).

In operation S280, it is determined whether the A value and the B value are the same. If the A value and the B value are the same, the procedure ends. On the other hand, if the B value is larger than the A value, operation S290 is executed.

In operation S290, the voltage level of back-bias may be changed. For example, the voltage controller 230 may change the voltage level of back-bias in order to increase the level of the threshold voltage of a transistor. As a result, since the leakage current from a transistor is reduced, the power consumption amount B increased by the leakage current will decrease.

Figure 11:
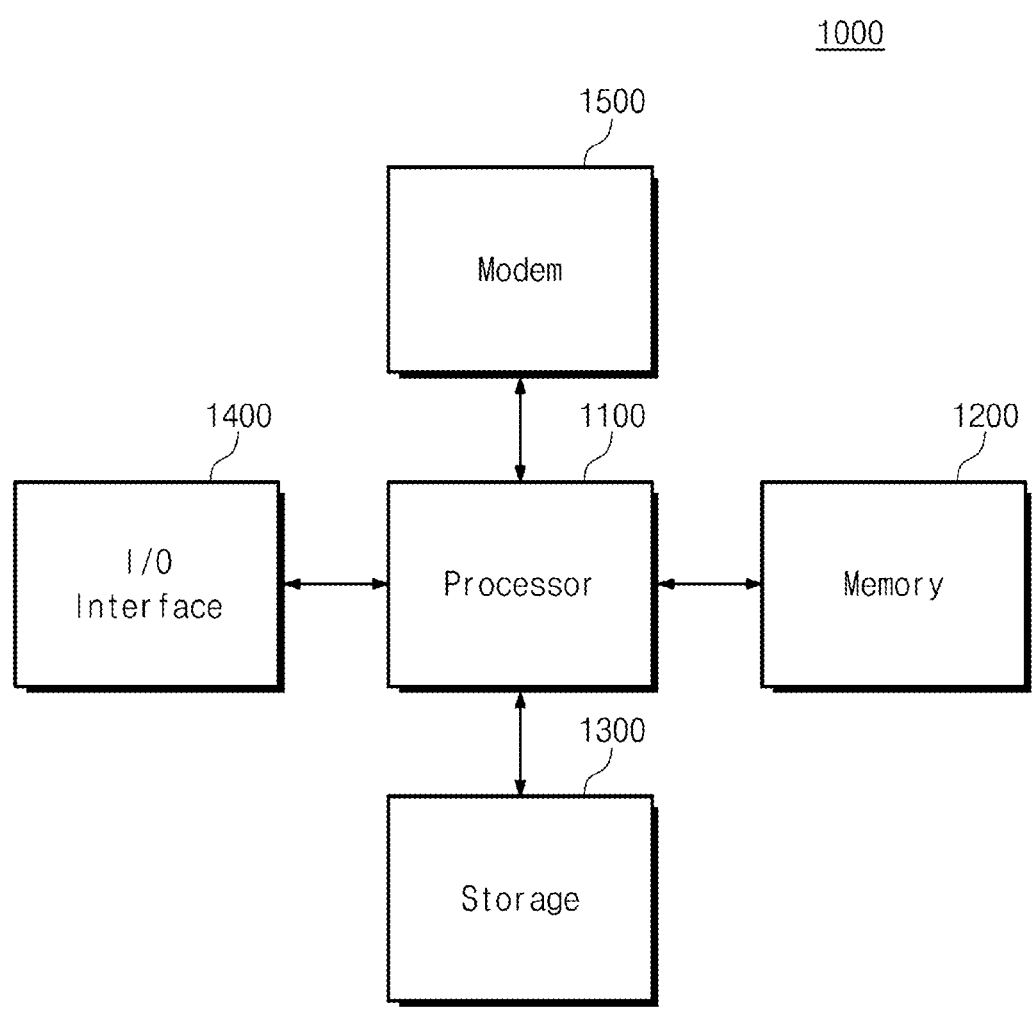
FIG. 11 is a block diagram illustrating a user system where a semiconductor device is applied according to an embodiment of the inventive concept.

FIG. 11 is a block diagram illustrating a user system where a semiconductor device is applied according to an embodiment of the inventive concept. Referring to FIG. 11, a user system 1000 may include a processor 1100, a memory 1200, a storage device 1300, an input/output interface 1400, and a modem 1500. Exemplarily, the user system 1000 may include at least one of a computer, portable computer, an Ultra Mobile PC (UMPC), a workstation, a net-book, a PDA, a portable computer, a web tablet, a wireless phone, a mobile phone, a smart phone, a digital camera, a digital audio recorder, a digital audio player, a digital picture recorder, digital picture player, a digital video recorder, a digital video player, a device for transmitting/receiving information in a wireless environment, and various computing systems configuring a home network. Alternatively, the user system 1000 may include components configuring Internet of Things (IoT) or a low power digital circuit.

Exemplarily, the user system 1000 is not limited to the components shown in FIG. 11. For example, the user system 1000 may only some of the shown components or may further include other components other than the components shown in FIG. 11.

The processor 1100 may drive components included in the user system 1000 or perform various arithmetic operations. Exemplarily, the processor 1100 may be provided as a low power digital circuit and may be the semiconductor device described with reference to FIGS. 1 to 10.

The memory 1200 may be used as a main memory, a buffer memory, or a cache memory of the processor 1100. The memory 1200 may be provided as a random access memory device such as Dynamic Random Access Memory (DRAM), Synchronous DRAM (SDRAM), Static RAM (SRAM), Double Date Rate SDRAM (DDR SDRAM), DDR2 SDRAM, DDR3 SDRAM, Phase-change RAM (PRAM), Magnetic RAM (MRAM), and Resistive RAM (RRAM). Exemplarily, the memory 1200 may include the semiconductor device described with reference to FIGS. 1 to 10, and a semiconductor device in the memory 1200 may control an operation of the memory 1200.

The storage device 1300 may be a mass storage medium of the user system 1000. The storage device 1300 may be provided as a mass storage semiconductor memory device such as Phase-change RAM (PRAM), Magnetic RAM (MRAM), Resistive RAM (RRAM), NAND flash, or NOR flash or a mass storage magnetic disk device such as Hard Disk Drive (HDD). Exemplarily, the storage 1300 may include the semiconductor device described with reference to FIGS. 1 to 10, and the semiconductor device may be used as a controller for controlling an operation of the storage 1300.

The input/output interface 1400 provides an interface for inputting or outputting data or instructions to the user system 1000. The input/output interface 1400 may be provided as input/output devices such as a camera, a touch screen, a motion recognition module, a microphone, a display, and a speaker.

The modem 1500 may perform communication with external devices. Exemplarily, the model 1500 may support wireless communications such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, and WI-DI.

Exemplarily, each component in the user system 1000 may be implemented with the semiconductor device described with reference to FIGS. 1 to 10 or may include a semiconductor device. A semiconductor device of each component may control an operation of the each component or perform various arithmetic operations according to a control of an external device.

According to the inventive concept described above, a semiconductor device may include a target circuit, a monitoring circuit for measuring the temperature or speed of the target circuit, and a voltage controller for providing a driving voltage and a back bias voltage(s). The target circuit may include a transistor whose level of a threshold voltage is adjusted by applying back-biasing. The monitoring circuit may include a device for measuring the temperature of the target circuit, and a device for measuring the delay time between the input and the output of the target circuit. The voltage controller may generate a driving voltage below a certain critical voltage at which TEI characteristics occur. The voltage controller may adjust the driving voltage and/or the back-bias voltage of a target circuit in consideration of the system specification, the amount of residual battery, the type of task to be performed, and the like. As a result, the power consumption of a semiconductor device may be reduced.

According to an embodiment of the inventive concept, since a semiconductor device is driven using TEI, the performance of the semiconductor device may be maintained above the reference performance and the power consumption may be reduced at the same time.

Further, since the threshold voltage of a transistor is adjusted using back-biasing, the performance of a semiconductor device may be further improved or the power consumption may be further reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A semiconductor device comprising:
   a target circuit including a transistor;
   a monitoring circuit configured to measure a temperature of the target circuit and a delay time between an input and an output of the target circuit; and
   a voltage controller configured to:
      adjust, according to the measurement of the temperature and the measurement of the delay time, 1) a driving voltage for driving the target circuit to be less than or equal to a critical voltage and 2) a back-bias voltage for adjusting a threshold voltage of the transistor, and
      provide the driving voltage and the back-bias voltage to the target circuit,
   wherein when the driving voltage is less than or equal to the critical voltage, as the temperature increases, the delay time decreases, and
   wherein when the driving voltage is greater than the critical voltage, as the temperature increases, the delay time increases.

2. The semiconductor device of claim 1, wherein the controller adjusts at least one of the driving voltage and the back-bias voltage according to a first power consumption amount decreased by the adjusted driving voltage and a second power consumption amount increased by the adjusted back-bias voltage.

3. The semiconductor device of claim 2, wherein when the first power consumption amount is greater than the second power consumption amount, the controller adjusts a level of the back-bias voltage to lower a level of the threshold voltage.

4. The semiconductor device of claim 2, wherein when the first power consumption amount is less than the second power consumption amount, the controller adjusts a level of the back-bias voltage to raise a level of the threshold voltage.

5. The semiconductor device of claim 1, wherein the controller adjusts at least one of the driving voltage and the back-bias voltage by referring to a table of one or more relationships between two or more of the temperature, the delay time, the threshold voltage, and the driving voltage.

6. The semiconductor device of claim 1, wherein the monitoring circuit comprises:
   a temperature sensor configured to measure the temperature of the target circuit; and
   a ring oscillator, wherein the ring oscillator is used to measure the delay time between the input and the output of the target circuit.

7. The semiconductor device of claim 1, wherein the driving voltage is an Ultra-Low Voltage (ULV) of 1 V or less.

8. The semiconductor device of claim 1, wherein the transistor comprises at least one of a MOSFET transistor, a FinFET transistor, and a dual gate transistor.

9. The semiconductor device of claim 1, wherein the delay time is a delay time between an input signal to a gate electrode of the transistor and an output signal from the transistor.

10. The semiconductor device of claim 1, wherein the voltage controller comprises:
    a driving voltage controller configured to adjust the driving voltage; and
    a back-bias controller configured to adjust the back-bias voltage.

11. A method of operating a semiconductor device including a transistor, the method comprising:
    measuring a temperature of the transistor and a delay time between an input and an output of the transistor;
    adjusting a driving voltage for driving the transistor to be less than or equal to a critical voltage, according to the temperature and the delay time; and
    adjusting a back-bias voltage for adjusting a threshold voltage of the transistor,
    wherein when the driving voltage is less than or equal to the critical voltage, as the temperature increases, the delay time decreases, and
    wherein when the driving voltage is greater than the critical voltage, as the temperature increases, the delay time increases.

12. The method of claim 11, further comprising:
    calculating a first power consumption amount decreased by the adjusted driving voltage;
    calculating a second power consumption amount increased by the adjusted back-bias voltage; and
    comparing the first power consumption amount with the second power consumption amount.

13. The method of claim 12, further comprising:
    when the first power consumption amount is greater than the second power consumption amount, adjusting a level of the back-bias voltage to lower a level of the threshold voltage.

14. The method of claim 12, further comprising:
    when the first power consumption amount is less than the second power consumption amount, adjusting a level of the back-bias voltage to raise a level of the threshold voltage.

15. The method of claim 11, wherein the adjusting of the driving voltage and the adjusting of the back-bias voltage are performed at the same time or at different times.

* * * * *